(12) United States Patent
Hsu et al.

(10) Patent No.: US 9,443,840 B2
(45) Date of Patent: Sep. 13, 2016

(54) METHODS AND APPARATUS FOR ESD STRUCTURES

(71) Applicant: Taiwan Semiconductor Manufacturing Company, Ltd., Hsin-Chu (TW)

(72) Inventors: Yu-Ying Hsu, Pingzhen (TW); Tzu-Heng Chang, New Taipei (TW); Jen-Chou Tseng, Jhudong Township (TW); Ming-Hsiang Song, Shin-Chu (TW); Johannes Van Zwol, Beek-Ubbergen (NL); Taede Smedes, Nijmegen (NL)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/559,047

(22) Filed: Dec. 3, 2014

(65) Prior Publication Data
US 2015/0084154 A1    Mar. 26, 2015

Related U.S. Application Data

(63) Continuation of application No. 13/710,147, filed on Dec. 10, 2012, now Pat. No. 8,921,943.

(51) Int. Cl.
| | |
|---|---|
| *H01L 29/735* | (2006.01) |
| *H01L 27/02* | (2006.01) |
| *H01L 21/265* | (2006.01) |
| *H01L 29/66* | (2006.01) |

(52) U.S. Cl.
CPC ......... *H01L 27/0262* (2013.01); *H01L 21/265* (2013.01); *H01L 27/027* (2013.01); *H01L 27/0255* (2013.01); *H01L 27/0259* (2013.01); *H01L 29/6609* (2013.01); *H01L 29/6625* (2013.01); *H01L 29/735* (2013.01)

(58) Field of Classification Search
CPC ........... H01L 29/0661; H01L 29/0611; H01L 27/0262; H01L 27/0259; H01L 29/6625; H01L 29/735; H01L 21/265; H01L 29/6609; H01L 27/0292; H01L 27/0647; H01L 27/067; H01L 27/0722; H01L 27/075
See application file for complete search history.

(56) References Cited

U.S. PATENT DOCUMENTS

| | | |
|---|---|---|
| 5,892,262 A | 4/1999 | Wu et al. |
| 6,979,869 B2 | 12/2005 | Chen et al. |
| 7,911,750 B2 | 3/2011 | Zhan et al. |
| 2003/0174452 A1 | 9/2003 | Chen et al. |
| 2005/0082621 A1 | 4/2005 | Chen et al. |
| 2009/0268361 A1 | 10/2009 | Mallikarjunaswamy |
| 2012/0091530 A1 | 4/2012 | Campi, Jr. et al. |

*Primary Examiner* — Cuong B Nguyen
(74) *Attorney, Agent, or Firm* — Slater Matsil, LLP

(57) ABSTRACT

Methods and apparatus for ESD structures. A semiconductor device includes a first active area containing an ESD cell coupled to a first terminal and disposed in a well; a second active area in the semiconductor substrate, the second active area comprising a first diffusion of the first conductivity type for making a bulk contact to the well; and a third active area in the semiconductor substrate, separated from the first and second active areas by another isolation region, a portion of the third active area comprising an implant diffusion of the first conductivity type within a first diffusion of the second conductivity type and adjacent a boundary with the well of the first conductivity type; wherein the third active area comprises a diode coupled to the terminal and reverse biased with respect to the well of the first conductivity type.

20 Claims, 9 Drawing Sheets

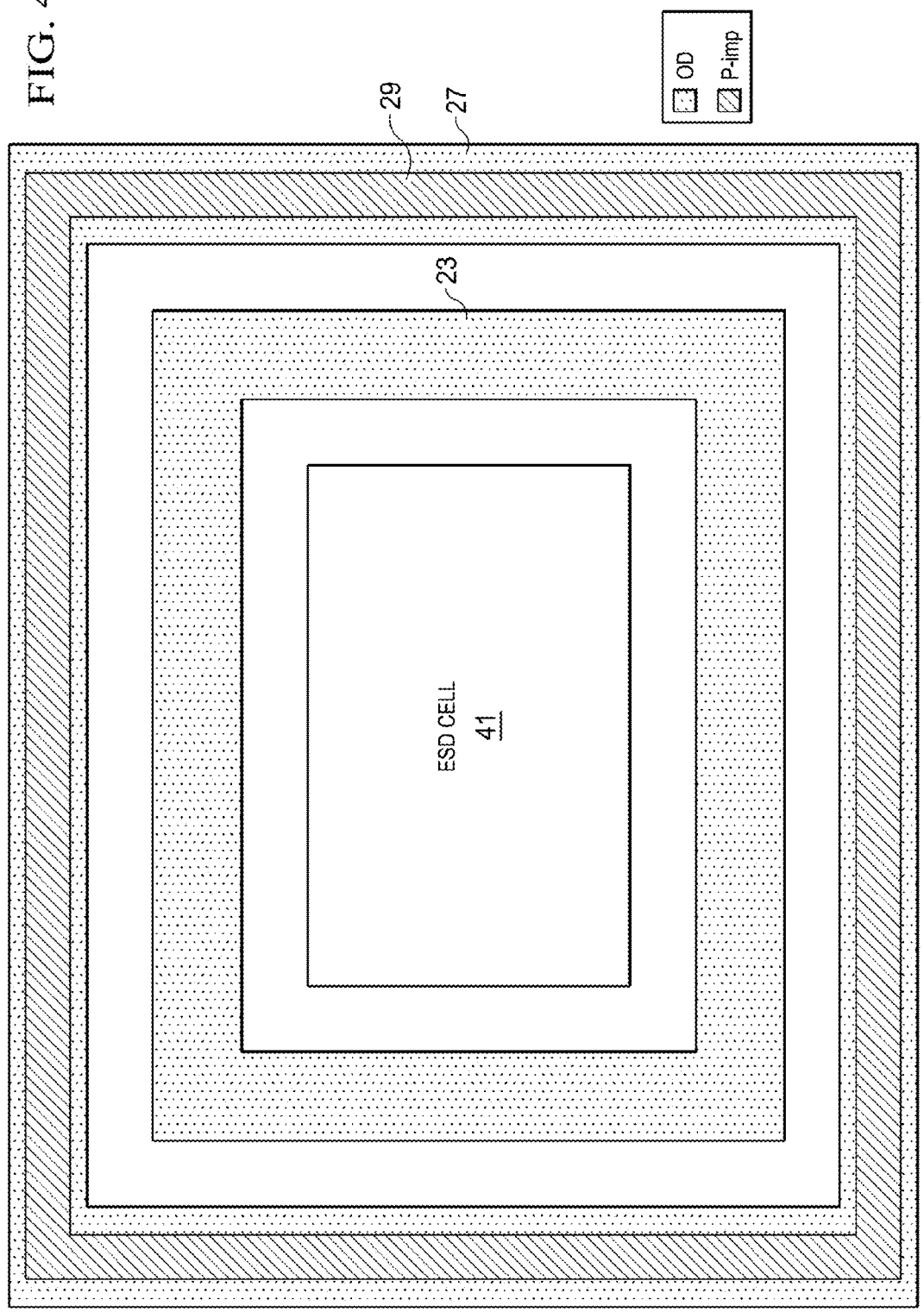

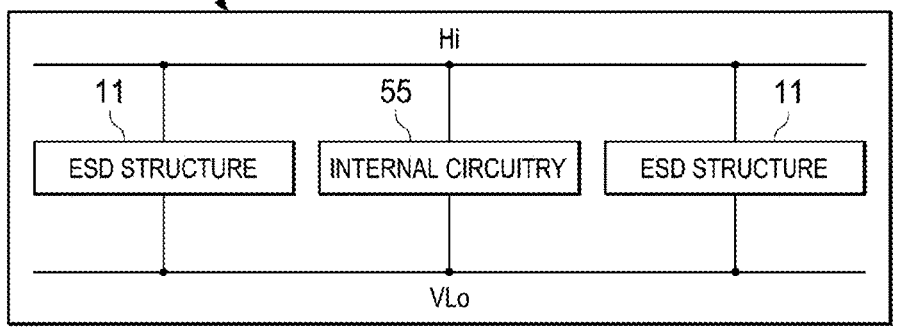
FIG. 10
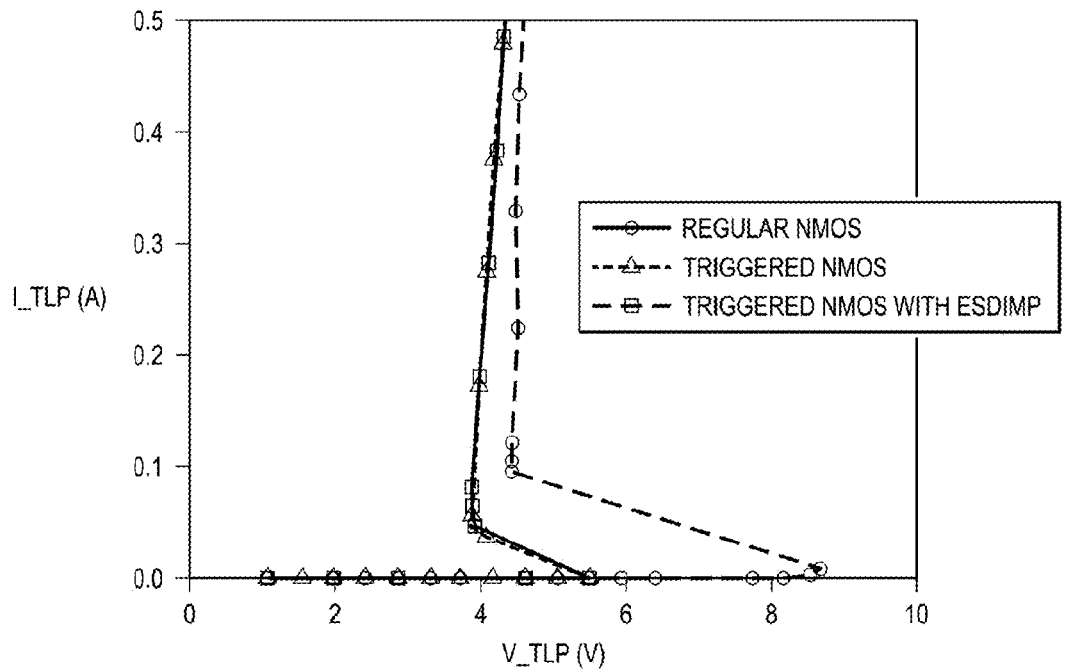
FIG. 11
FIG. 12
| DEVICE | W (μm) | L (μm) | RPO (μm) | ESD imp @ INSERTED OD | 100ns TLP | | |
|---|---|---|---|---|---|---|---|
| | | | | | Vt1(V) | Vh(V) | It2(A) |
| REGULAR NMOS | 360 | 0.4 | 1.95 | – | 8.69 | 4.42 | 2.31 |
| | | | 1 | – | 8.68 | 4.43 | 2.23 |
| TRIGGERED NMOS | 360 | 0.4 | 1.95 | – | 5.50 | 3.88 | 3.06 |
| | | | | Y | 5.49 | 3.88 | 3.89 |
| | | | 1 | Y | 5.51 | 3.84 | 3.22 | ns
METHODS AND APPARATUS FOR ESD STRUCTURES

This application is a continuation of U.S. patent application Ser. No. 13/710,147, filed Dec. 10, 2012, entitled, "Methods and Apparatus for ESD Structures," which application is hereby incorporated herein by reference.

BACKGROUND

Electrostatic discharge ("ESD") protection structures are needed for integrated circuits. In ESD protection, the ESD circuit provides a path to bypass current from the terminal to a ground or from the terminal to a power supply rail, so that the current due to an ESD event bypasses the internal circuitry. Voltages far in excess of the normal operating voltages, in both positive and negative magnitudes, are observed during short duration electrostatic discharge events. The ESD protection structures prevent the corresponding ESD current from destroying sensitive components in an integrated circuit. Without ESD protection the devices coupled to the power terminal would fail.

ESD structures are often formed from so-called "parasitic" transistors that are formed when MOS or field oxide (FOX) devices are fabricated over a semiconductor substrate. For example, when a MOS device is formed having a gate terminal over a gate dielectric that overlies the substrate, source and drain diffusion regions are formed on opposite sides of the channel region beneath the gate terminal. Because the source and drain regions are of opposite conductivity type to the substrate, a lateral NPN or PNP bipolar transistor forms with its base in the substrate or well region. This device provides a current path that may be used as an ESD circuit. Silicon controlled rectifier (SCR) circuits of two bipolar parasitic transistors are also used as ESD structures.

Existing ESD protection circuits have relatively slow turn on speed and relatively high trigger voltages. As the semiconductor devices produced become increasingly smaller, the thin gate oxides formed become ever more susceptible to ESD. Improved ESD circuits are needed with low trigger voltages, without substantially increasing silicon area.

BRIEF DESCRIPTION OF THE DRAWINGS

For a more complete understanding of the illustrative embodiments, reference is now made to the following descriptions taken in conjunction with the accompanying drawings, in which:

FIG. 4 depicts, in a plan view the illustrative embodiment of FIG. 2;

FIG. 10 depicts, in a block diagram, an integrated circuit embodiment;

FIG. 11 depicts, in a graph, an I-V curve for an embodiment structure; and

FIG. 12 depicts, in a comparison, table results obtained for embodiment structures.

Corresponding numerals and symbols in the different figures generally refer to corresponding parts unless otherwise indicated. The figures are drawn to clearly illustrate the relevant aspects of the illustrative example embodiments and are not necessarily drawn to scale.

DETAILED DESCRIPTION

Figure 1:
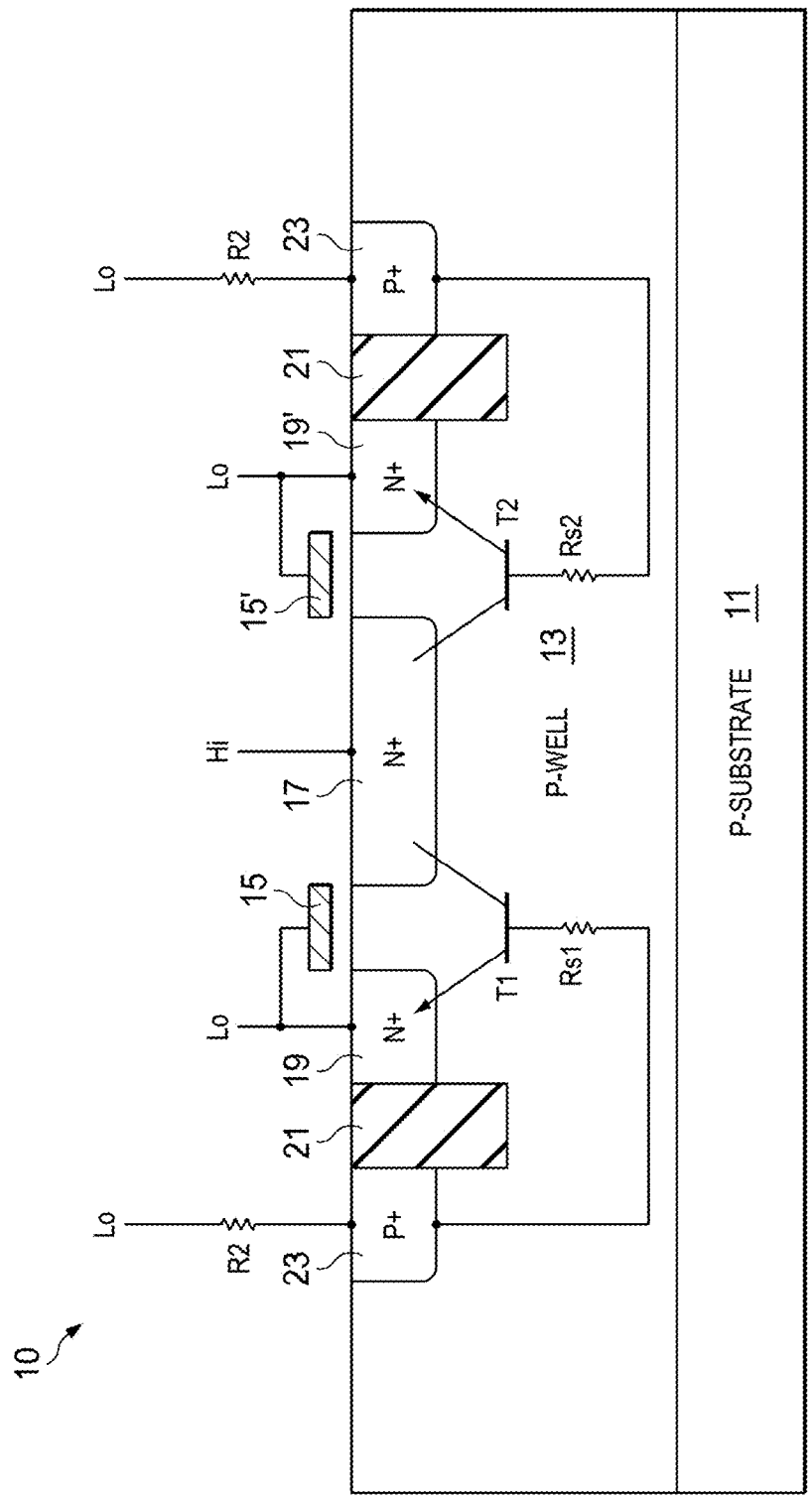
FIG. 1 depicts, in a cross sectional view, an ESD structure on a semiconductor substrate for use with the embodiments.

The making and using of illustrative example embodiments are discussed in detail below. It should be appreciated, however, that an illustrative embodiment provides many applicable inventive concepts that can be embodied in a wide variety of specific contexts. The embodiments herein are illustrative examples used for explanation but do not limit the scope of the disclosure, and do not limit the scope of the appended claims.

In the embodiments, ESD structures are formed using approaches that include providing a diode in an active area proximate to the ESD structure. The diode is arranged to have a low breakdown voltage. The diode is reverse biased and is coupled to a well region of the ESD structure. The ESD structure includes diffused regions in the well (or substrate) in an active area surrounded by isolation regions. Another active area forms a well surrounding the ESD structure and has a diffusion region for a bulk contact to the well. The diffusion regions in the well region of the ESD structure form the collector-base and base-emitter junctions of at least one lateral bipolar transistor, with a terminal to be protected from a transient voltage during an ESD event coupled to the collector. The well or substrate acts as the base of the lateral bipolar transistor. The diode is reverse biased between the well region and the diffusion region. During an ESD event, the diode is reverse biased with respect to the terminal, and breaks down in a revere direction when an avalanche or breakdown voltage is reached, conducting current into the well region. The potential at the base-emitter junction of the lateral bipolar transistor increases due to the breakdown current flowing in the well region, and the lateral bipolar transistor of the ESD structure can turn on earlier than it would without the current from the breakdown voltage diode. By increasing the size of the areas and/or the area of the ESD implant region that form the diode, the ESD structure trigger voltage can be adjusted. The use of a second active region to form the diode provides a breakdown voltage diode that is compatible with many semiconductor processes, including processes for lateral double diffusion MOS (LDMOS) transistors.

In an embodiment, the low breakdown voltage diode is formed as a p-n junction arranged in reverse bias direction, and coupled to a pad. The diode is formed near the ESD structure, which is also coupled to the pad. As the diode goes into a breakdown mode during a transient pulse voltage event at the pad, such as during an ESD strike, the current supplied into the well or substrate and into the well region provides a potential at the base of the lateral bipolar transistors and this potential turns on the ESD circuit. By providing a pre-trigger current to the base region early in the transient event, the ESD circuit can turn on earlier, and at a lower trigger voltage, due to the use of the novel diode structure. The diode structure can be placed in an active area provided near the ESD device either inside, or outside, a well region active area surrounding the ESD active area. By adding the diode structure to the ESD structure of the embodiments, the trigger voltage for the ESD structure may be lowered, and by changing the area or the ESD implant region for the p-n diffusions for the diode structure, the embodiments provide an adjustable trigger voltage.

FIG. 1 depicts in a cross sectional view, an example embodiment of an ESD structure 10. In FIG. 1, a portion of a semiconductor substrate 11 is depicted. Semiconductor substrate 11 is shown as a p-type doped substrate, and may be formed from silicon, gallium arsenide, silicon germanium or other known semiconductor materials used in semiconductor device processing. Although in the illustrated examples presented herein for explanation a semiconductor substrate is used, in other alternative embodiments epitaxially grown semiconductor materials may be used, or, silicon on insulator (SOI) layer may be used, as the substrate 11. While the semiconductor substrate 11 may be doped with either N-type or P-type impurities, in the examples presented herein the substrate 11 is a P-type substrate.

Dopant impurities are implanted into the semiconductor material to form P+, and, P-type regions in semiconductor material, and N+ and N-type regions, as is well known. Dopant atoms for P-type regions include boron, for example. In N-type regions, dopant atoms include phosphorous, arsenic, and antimony, for example. Doping may be done by ion implantation processes. When coupled with photolithographic processes, doping may be performed in selected areas by implanting atoms into exposed regions while other areas are masked. Also, thermal drive or anneal cycles may be used to use thermal diffusion to expand or extend a previously doped region. As alternatives, some epitaxial deposition of semiconductor materials allow for in-situ doping during the epitaxial processes. Implantation can be done through certain materials, such as thin oxide layers, as is known. Concentrations following the doping may range from 1E16 atoms/cm$^3$ to 1E22 atoms/cm$^3$, with P+ and N+ concentrations being greater than about 1E18/cm$^3$, for example.

In FIG. 1, a well region 13 is shown as a P-well. Well regions may be formed using two different dopants implanted into substrate 11. Alternatively, a doped substrate, such as a P type substrate, may be doped only to form an N well, with the remainder of the substrate 13 acting as the P well. In the example embodiment, a P-well 13 is formed by doping with P type dopant atoms in the upper portion of substrate 11. Double well processes may be used in alternative embodiments.

Semiconductor manufacturing processes that may be used to form the structure 10 include photolithography, wet and dry etching, plasma etching, ashing, chemical vapor deposition, plasma vapor deposition, plasma enhanced chemical vapor deposition, electroless plating and electroplating, silicidation, oxide deposition including thermal oxidation, TEOS, spun on glass and other oxide and nitride depositions, planarization processes such as CMP, forming isolation regions using trenches or local oxidation of silicon (LOCOS) and the like. Examples of ESD structures that have P and N diffusions and doped wells, and example processes for forming them, are described in patent application U.S. Ser. No. 13/176,780, entitled "Bidirectional Dual-SCR Circuit for ESD Protection," filed Jul. 6, 2011, which is hereby incorporated herein by reference in its entirety.

Returning to FIG. 1, a drain terminal 17 is formed as a doped N+ diffusion. In this example embodiment, the drain region 17 is used as a drain for two MOS transistors to form two structures in parallel, as described below. N+ doped source diffusions 19 and 19' are also formed in the semiconductor substrate 11, spaced from the doped drain diffusion 17 by a portion of the P-well 13, which forms two channel regions, each one between the drain region 17 and the respective source regions 19 and 19'. Gates 15 and 15' are formed overlying the surface of the P-well 13 and with the source regions 19 and 19' and drain region 17, these form two MOS transistors. A gate dielectric (not shown) lies underneath the gates 15 and 15' and is selected from an oxide, nitride, silicon dioxide, a high-k or low-k dielectric, or other dielectric materials used in semiconductor processes. Gates 15 and 15' are, in one embodiment, doped polysilicon. In other embodiments polysilicon, and metal gate materials are used. Since the source and drain regions 19, 19' and 17 are doped to an N+ type, and the well 13 is a P-type, two NMOS transistors are formed in the structure of FIG. 1. The doping concentration amounts for the well region and the N+ diffusions described may vary with the process used and the particular design but may range from 1E16 to 1E22 atoms/cm3, for example. P+ and N+ regions are usually doped to greater than 1E18 atoms/cm3, for example although other impurity concentrations can be used.

The gates 15 and 15' are shown coupled to a "Lo" voltage such as a ground potential, so the structure 10 is formed of two grounded gate NMOS devices, coupled in parallel between a "Hi" (for example, Vdd, or other positive voltage supply) potential at the drain terminal 17, and the Lo potential at the source terminals 15, and 15'.

The drain diffusion 17, the P-well 13, and the source diffusions 19 and 19', are two NPN devices T1 and T2 coupled in parallel. In this example embodiment, these lateral NPN transistors provide the ESD protection. In alternative embodiments, only one NPN transistor is provided by a using a single grounded gate NMOS device. In additional embodiments, the ESD structure could be, instead of an NMOS or MOS device, a field oxide device with two diffusion regions (FOX ESD structure), or a silicon controlled rectifier (SCR) device with N+ and P+ diffusions to provide an NPNP or PNPN conductive path. In all of the embodiments, the P-well region acts as a base for one or more bipolar parasitic transistors.

The collector of the parasitic transistors T1, T2 is the drain region 17. The base for each of the parasitic transistors T1, T2, is the P-well region 13. The emitters for each of the parasitic transistors T1, T2, are the source diffusions 19 and 19'.

The active area containing the ESD circuit of the grounded gate NMOS transistors formed by gates 15 and 15' is bounded by isolation ring 21. This electrical isolation may be formed, for example, using shallow trench isolation (STI), where an oxide, nitride or similar dielectric is formed in a trench region. Alternative embodiments include local oxidation of silicon (LOCOS) isolation. The P+ diffusions 23 form a well ring around the isolation 21, and this diffusion provides the bulk, or body contact for the P-well 13. By coupling this bulk terminal to ground, there is a path to ground through the P-well. Resistors R2 are optionally used to bias the P-well 13 above the Lo voltage, to create a "gate coupling" effect.

The drain diffusion 17 and the P-well region 13 provide a P-N junction. From the Hi terminal this junction is reverse biased. During a high voltage transient pulse, such as during an ESD event, at the Hi terminal, the reverse junction will eventually enter a break down mode, and conduct current into the P-well to the Lo terminal through the bulk contact diffusions 23, 23'. The current flowing into the P-well will cause a potential at the base of transistors T1, T2 and turn on the parasitic transistors, conducting current through the base-emitter junctions between the P-well 13 and the source terminals 19, 19'.

However, the ESD trigger voltage for the arrangement in FIG. 1 is higher than desired to provide the necessary protection for "victim" devices coupled to the Hi terminal on an integrated circuit, for example. A conventional approach to lowering the trigger voltage so as to turn on the lateral parasitic transistors T1, T2 at a lower voltage is to add a diffusion of P type material, called an "ESD implant," to the bottom of the drain region 17, near the junction with the P-well. However, this approach disadvantageously adds capacitance to the Hi terminal. Also, for LDMOS semiconductor processes, this approach cannot be used, because the N+ drain diffusion 17 sits within an N-well in the double diffusion devices of LDMOS. Thus the use of the "ESD implant" to improve the ESD structure is not compatible with N+ drain diffusion in an N-well, such as for a LDMOS device.

Figure 2:
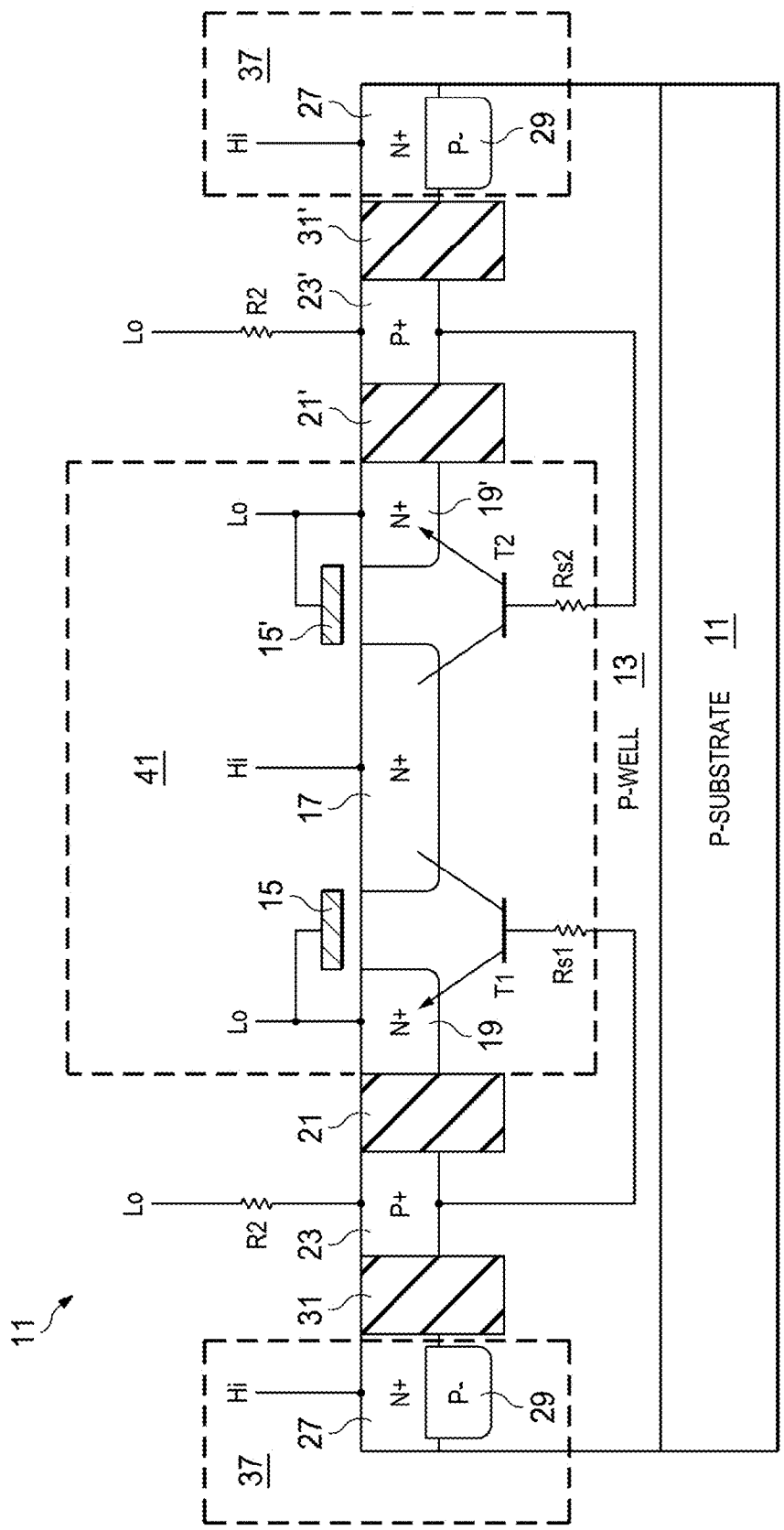
FIG. 2 depicts, in a cross sectional view, an ESD structure with an additional diode structure of the embodiments.

FIG. 2 depicts, in a cross sectional view, an ESD structure 11 with additional features of an embodiment. In FIG. 2, many of the numbered elements are the same as in FIG. 1 and like reference numerals are used for like elements. P-well 13 is again shown in cross section. Electrical isolation regions 21 surround the active area for the MOS devices formed with gates 15, and 15', as in FIG. 1. These elements form an ESD cell 41. In the example shown, two grounded gate NMOS devices are formed. In alternative embodiments, cell 41 may be one or more FOX ESD devices, where the gates 15 and 15' are not present, and a field oxide layer (FOX) is formed between two diffusion regions, the lateral npn transistors T1, T2 are still formed and trigger in a similar fashion. In another alternative, ESD cell 41 includes one or more SCR devices, which use N+ and P+ diffusions to form NPNP or PNPN current paths.

A well diffusion 23 surrounds the active area for the ESD cell 41, and because the cross section of FIG. 2 intersects the well region twice, it appears on both the left and right hand side of the figure. Well diffusion 23 may be a rectangle, square, round or oval shape surrounding the active regions containing the MOS structure. Further, the well diffusion 23 can be non-continuous segments or partially continuous portions to form additional alternative embodiments.

The example embodiment of FIG. 2 includes another active area containing diffusion 27, an N+ diffusion. As shown in this illustrative embodiment, this diode region 37 also has, in at least some portions, optional P− diffusions 29 which are similar to the "ESD implants" described above. By adding the optional P− diffusions to the active areas 27, a low breakdown voltage (low BV) diode 37 is formed from diffusions 27 and 29 proximate to the ESD cell 41. The diffusion 27, which is N+, and the P-well 13, which couples to P-substrate 11, will also form a diode 37 in embodiments where the optional P− diffusion 29 is not used. The diode 37 may have several shapes, for example, in one embodiment, the diode 37 is a continuous ring around the isolation 31. The diode 37 is reverse biased when the N+ diffusion 27 is coupled to the terminal Hi—a high voltage supply, for example.

During a transient voltage pulse at the Hi terminal, the p-n junction of diffusions 29 and 27 is reverse biased; and at a breakdown voltage, enters a breakdown or avalanche mode and current flows from diode 37 into the P-well 13. In embodiments where the P− diffusion 29, which is optional, is not used, the p-n junction of diffusion 37 and P-well 13 is reverse biased and breaks down when sufficient voltage is on the "Hi" terminal, current then flows from diode 37 without the P− diffusion 29 and into the P-well region 13. This extra current causes a "pre-trigger" condition and due to the resistance in the P-well, causes a potential at the base or drive regions of the parasitic npn transistors T1 and T2. These lateral npn transistors T1 and T2 then turn on earlier than in prior approaches, providing a lower trigger voltage for the ESD protection. By changing the area of the implant region 29, or the area of N+ 27, the trigger voltage can be adjusted for a particular application. The use of the added diode 37 formed in an additional active area diffusion 27 is compatible with LDMOS processes as well as other processes, and does not have the same capacitance penalty as the prior approaches. The diode 37 is formed in a P well region, and not at the drain terminal, so the embodiment is compatible with LDMOS devices. The structure 11 is simple to manufacture using existing process steps.

Figure 3:
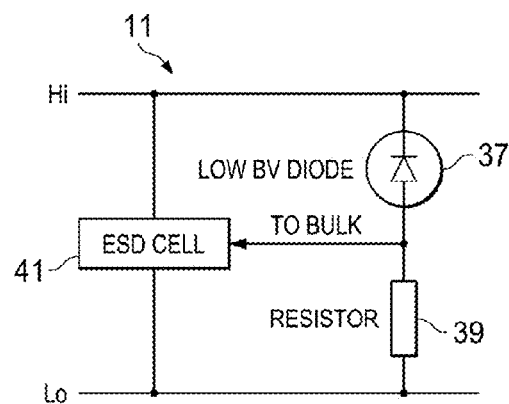
FIG. 3 depicts, in a simple circuit diagram, an embodiment circuit.

FIG. 3 depicts in a simplified circuit diagram the embodiments such as ESD structure 11 including a low BV diode 37 with the ESD cell 41. Cell 41 is coupled between a Hi terminal and Lo terminal. ESD device cell 41 may be a grounded gate NMOS structure as in FIGS. 1, and 2, a FOX structure or an SCR. In the embodiments, the well region, such as p-well 13, is the base of at least one bipolar transistor. The low BV diode 37 is coupled in reverse bias orientation between the pad to be protected, here the Hi voltage terminal, and the bulk or body contact. Resistor 39 is an optional resistor between the P-well 13, for example, and the Lo or ground terminal. This optional added resistor can increase performance and provide a "grounded gate" effect, but is not necessary for all of the embodiments.

In normal circuit operation, diode 37 is reverse biased with respect to the Hi terminal and does not conduct. However, in an ESD event that places a transient high voltage pulse on the Hi terminal, the diode 37 enters breakdown mode and conducts reverse or avalanche current. As the reverse current flows into the P-well 13 (see FIG. 2, above), and through resistor 39 or through the substrate resistance Rs1 in FIG. 2, a potential is developed on the "base" terminal of the parasitic transistors in the ESD structure, and the ESD cell 41 turns on. By lowering the trigger voltage (which is done by adjusting the low breakdown voltage of diode 37), the ESD structure performance is improved.

FIG. 4 depicts, in a plan view, an embodiment such as the one shown in cross section in FIG. 2. In FIG. 4, ESD cell 41 includes, for example, the grounded gate NMOS devices of FIG. 2, which are formed within an active area (OD). The well region 23 is formed as a rectangle or ring active area 23 surrounding the device area 41. The active area 27 is an N+ diffusion in an outermost active area with the optional P− diffusion 29 shown formed within it. In an additional embodiment, the optional P− diffusion 29 is not formed and the well region, which is also p-type, will form a diode with the N+ diffusion 27. Note the diffusion 27 may be any shape, including the example of a rectangular shape in FIG. 4, round, oval, or other shapes may also be used without limitation. By placing the diode proximate to the cell region 41 so that in a breakdown mode, the current from the reverse biased diode flows in to the P-well, the trigger voltage for the cell 41 is lowered as described above, and the ESD protection device will trigger earlier and at a lower voltage during a transient event, increasing ESD performance. (The isolation regions between the active areas are not shown in FIG. 4, for simplicity.)

Figure 5:
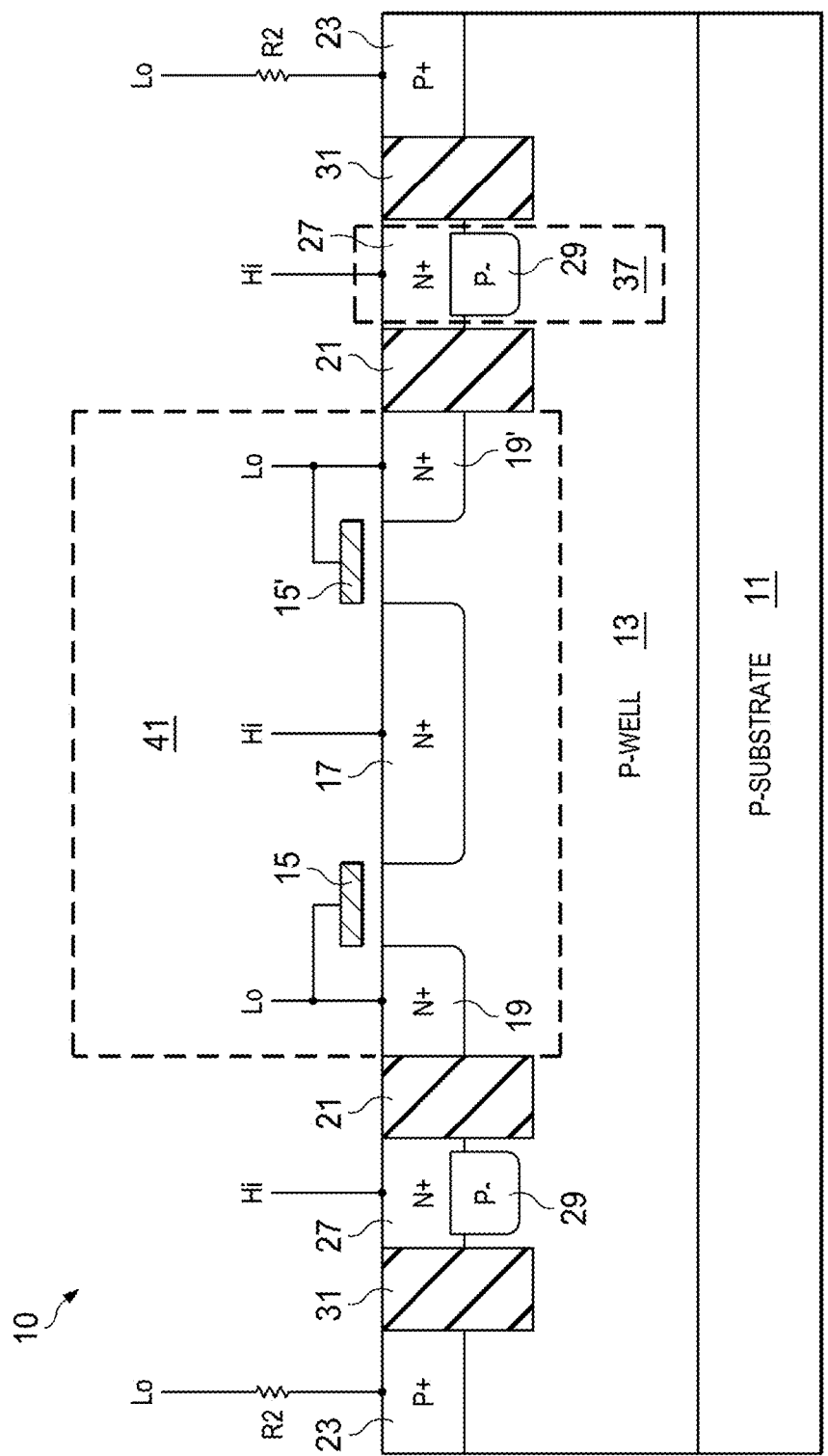
FIG. 5 depicts in a cross-sectional view, still another illustrative embodiment.

FIG. 5 depicts, in a cross sectional view, an alternative embodiment. In FIG. 5, the diode 37 formed from the N+ diffusion 27 and the P− diffusion 29 is in an active area adjacent to and surrounding the active area containing cell 41, and the well region 23 is in an active area in an outermost ring farther from the cell area 41. As described above, the P− diffusion 29 is optional and may be omitted, to form additional alternative embodiments. This example embodiment again illustrates a pair of parallel NMOS devices with gates 15 and 15' formed between a drain region 17 that is shared between the two NMOS devices, and source regions 19 and 19'. The 'Hi' terminal is shown coupled to the drain 17 and the 'Lo' terminal is coupled to the gates 15 and 15', and to the source regions 19 and 19'. The P-well 13 again forms the "base" terminal of the two lateral NPN parasitic transistors, as shown in FIG. 1 above. The operation of the low breakdown voltage diode formed by the diffusions 27 and 29 is the same as described above. During an event which causes a transient high voltage on the Hi terminal, the reverse biased diode breaks down, current flows in the P-well 13, and this added current provides a lowered trigger voltage for the NMOS devices with gates 15 and 15'.

Figure 6:
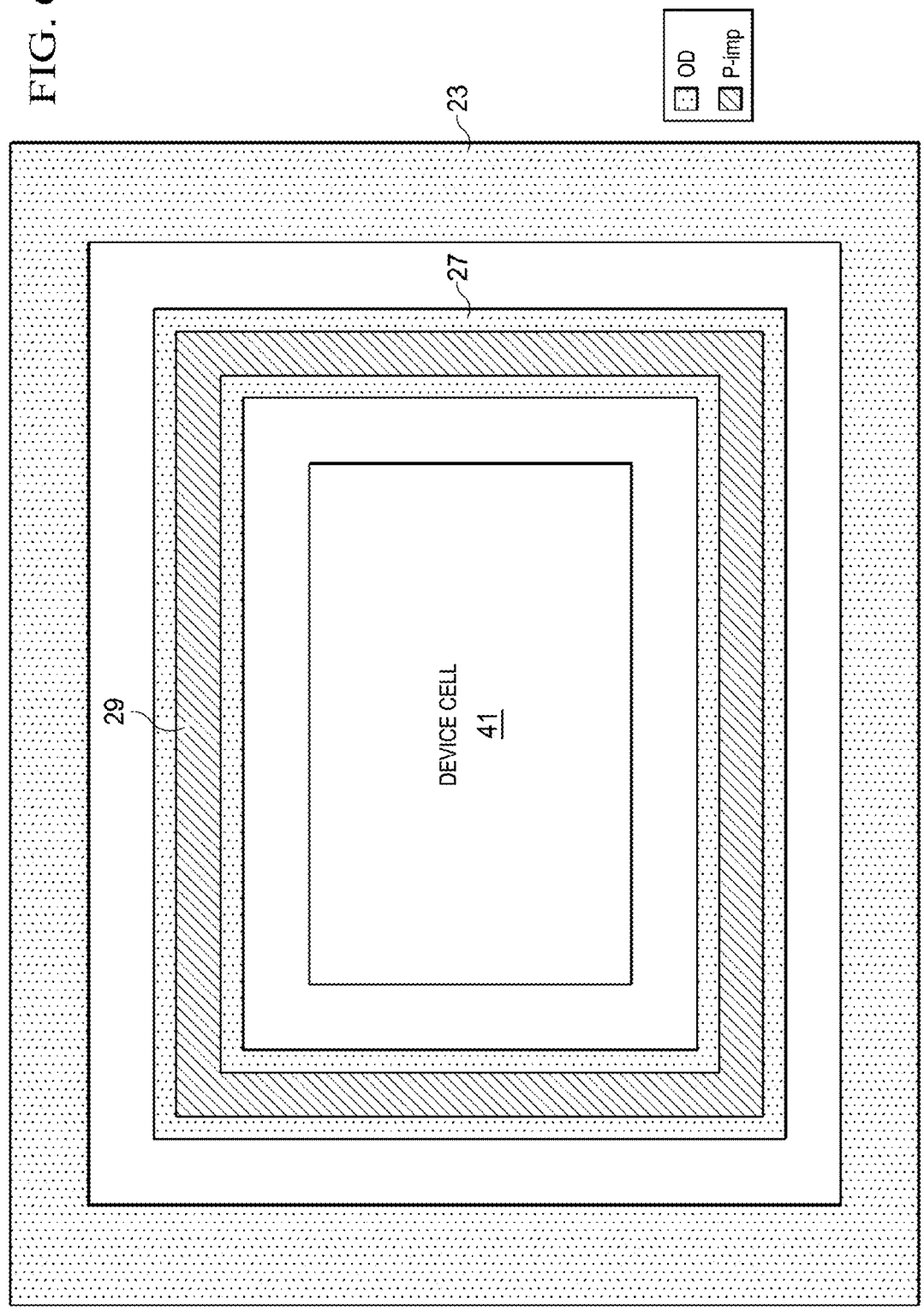
FIG. 6 depicts, in a plan view, the embodiment of FIG. 5.

FIG. 6 depicts the example embodiment of FIG. 5 in a plan view, and illustrates the diode portion including the N+ diffusion 27 and the optional P− implant 29 in an ring shaped active area inserted between the device/cell active area 41, and the well ring 23. (The isolation regions are not shown in this view, for simplicity). Note that in an additional alternative embodiment, the N+ diffusion is formed and forms a reverse biased diode with the P-well, without the use of the optional P− implant 29. Also, the N+ region 27 may be any shape, including square, rectangular, oval, circular, and the like, and is not limited to the rectangular examples shown here.

Figure 7:
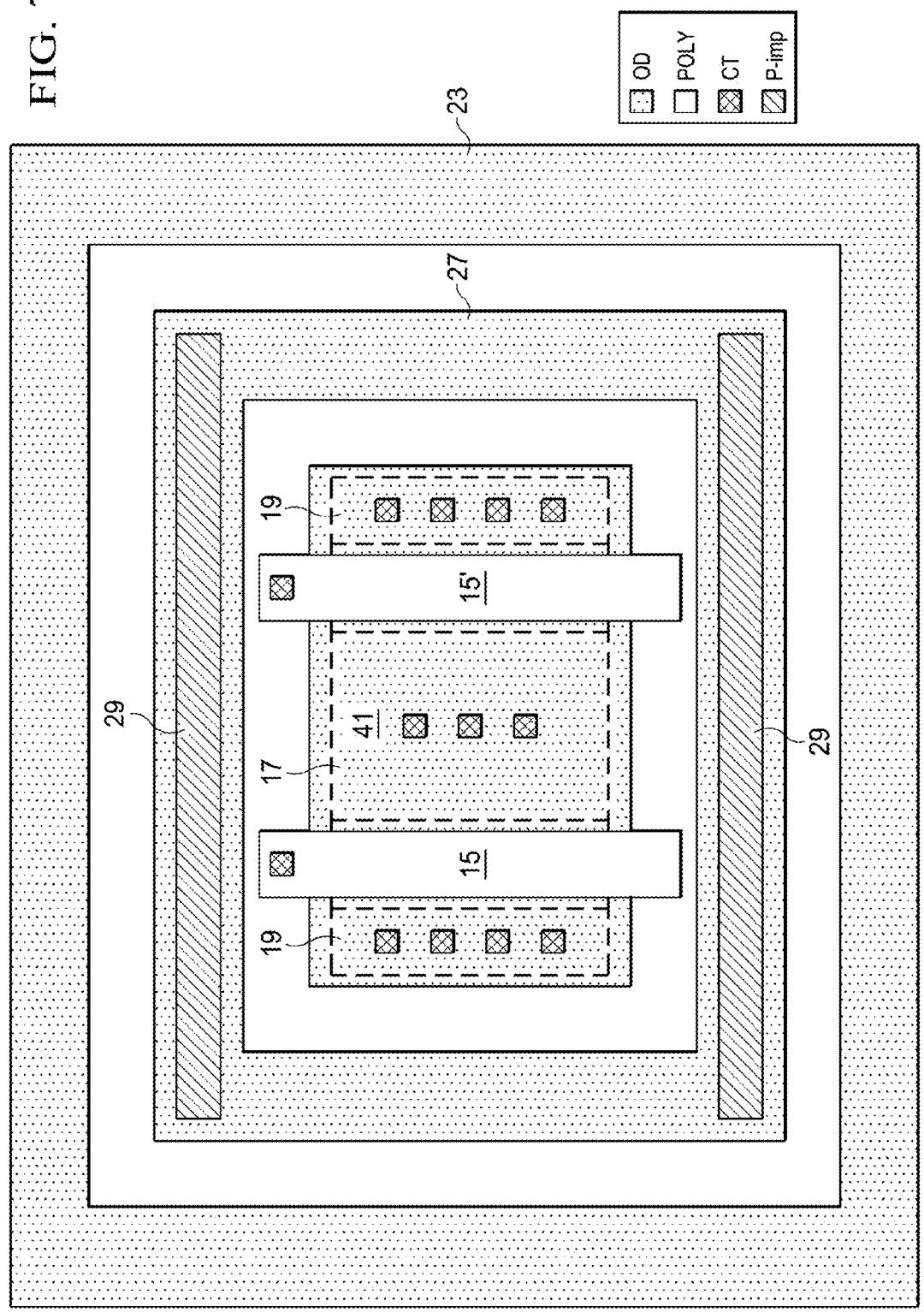
FIG. 7 depicts, in a plan view, another illustrative alternative embodiment.

FIG. 7 depicts an alternative embodiment in a plan view. In FIG. 7, some additional details are shown for an ESD device. Gates 15 and 15' are depicted overlying the P-well 13 in an active area containing cell 41. The source diffusions 19, 19' and drain diffusions 17 are shown in the active area 41. Contacts labeled CT are shown for the source and drain regions (not shown). The N+ diffusion 27 is shown in an active area surrounding the device active area 41. The optional P− implant 29 is now formed only in parts of the N-+ diffusion 27, while it is not formed in other parts. The well region 23 is again shown as an additional active area surrounding the other structures.

The embodiment of FIG. 7 illustrates that in alternative embodiments, the P− implant 29 for the low breakdown voltage diode formed with the diffusion 27 is not necessarily formed in all portions of the N+ diffusions 27. The optional P− implants can be segmented or formed in only portions of the N+ diffusions.

Figure 8A:
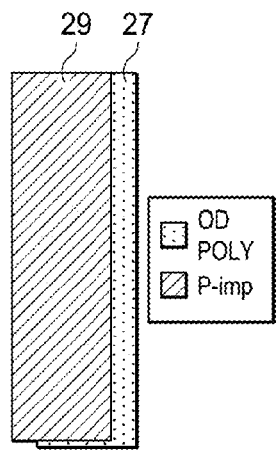
FIGS. 8A-8F depict alternative embodiments.
Figure 8B:
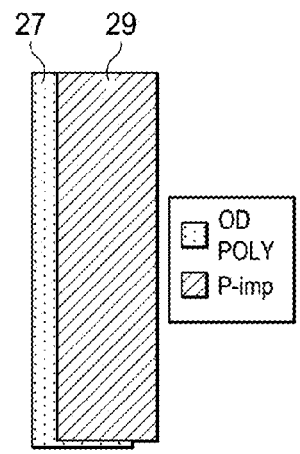
Figure 8C:
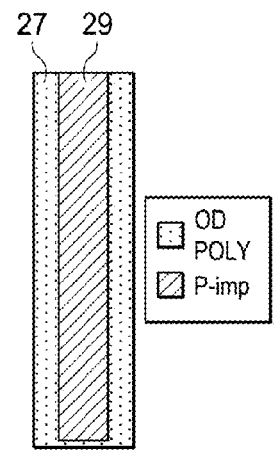
Figure 8D:
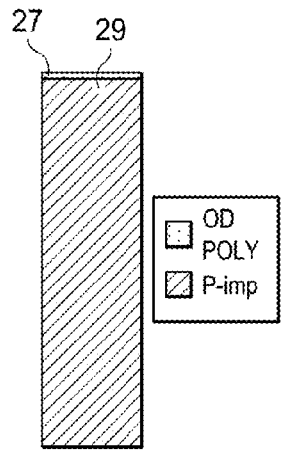
Figure 8E:
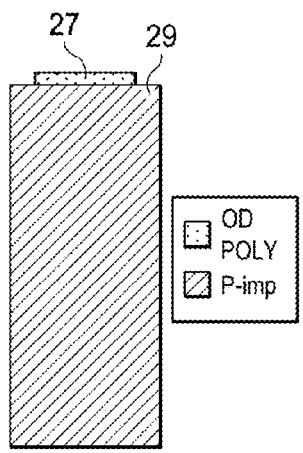
Figure 8F:
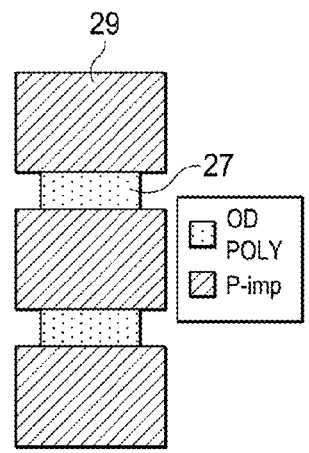

FIG. 8A-8F illustrates, in plan views, portions of additional possible alternative embodiments. The P− implant such as 29 does not have to be coextensive with the N+ diffusion 27 in the active areas for the diode; it may only be partially coextensive. In FIG. 8A, for example, the P− implant overlies one side of the N+ diffusion, but not the other, while FIG. 8B illustrates an overlap on the other side of the N+ diffusion. FIG. 8C illustrates an example where the P− implant is covered by the N+ diffusion. FIG. 8D illustrates an embodiment where the P− implant is coextensive with the N+ diffusion. FIG. 8E illustrates an embodiment where the P− implant is wider than the N+ diffusion. FIG. 8F illustrates an embodiment where the P− implant is segmented compared to the continuous N+ diffusion. All of the alternative embodiments of FIGS. 8A-8F provide diode structures for use with the embodiments. Changing the area of the p-n junction changes the size of the diode, and allows adjusting the trigger voltage for the ESD structure.

Figure 9:
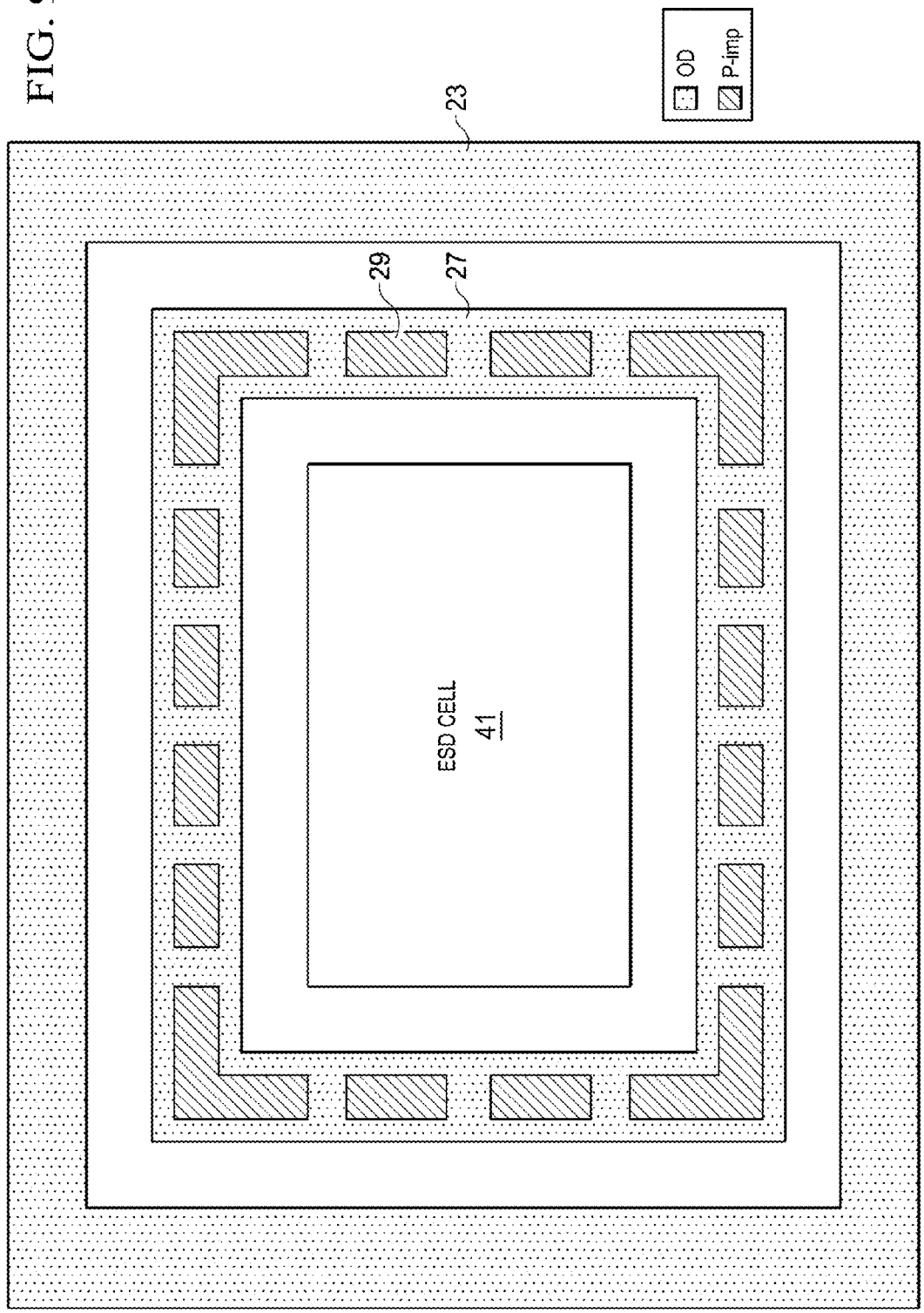
FIG. 9 depicts, in a plan view, yet another illustrative embodiment.

FIG. 9 depicts, in a plan view, an alternative embodiment with a segmented P− implant 29. ESD cell 41 is depicted with the active area for the diode, including N+ diffusion 27, formed around it. In this example embodiment, the P− implants 29 are formed as segments within the N+ diffusion 27. Well ring 23 is then formed surrounding the structures. This embodiment illustrates that the P− implants 29 may be formed in a variety of shapes and still provides the diode of the embodiments.

FIG. 10 illustrates in a block diagram an integrated circuit 51 including the embodiments. In FIG. 10, Hi terminal 53 is a positive supply pin for the integrated circuit. Internal circuitry 55 is coupled between the Hi and Lo terminals, for example between 3.3V and ground. This circuitry is potentially a "victim" circuit during an ESD strike such as a positive stress at the Hi terminal 53. ESD structures 11 are coupled to protect the internal circuitry. One or more of the ESD structures may be provided, in this example embodiment, two are used. In alternative embodiments, the ESD structure 11 may be coupled between an input pad and ground, an output pad and ground, etc. to provide additional ESD protection.

The breakdown voltage of the reverse biased diode such as 37 in FIG. 3 can be adjusted to be a voltage higher than the normal operating voltage of the "Hi" terminal (3.3V, 5.0V, etc) and high enough to be sure that the trigger point does not happen during normal operations of the device, but it should be low enough to prevent damage to devices coupled to the "Hi" terminal, for example MOS logic transistors. The ESD structures used such as 41 in FIG. 3 can be any structure that uses the P-well region as a base or drive region. The use of the resistor 39 is optional and when used, as current flows through the optional resistor to the Lo terminal, the resistor raises the P-well potential above the "Lo" terminal voltage to achieve an optional "gate coupled" effect. The grounded gate NMOS ESD structures will exhibit a "snap back" characteristic in the transient pulse I-V characteristic. As the voltage at the Hi terminal increases past the normal operating voltage in a transient event, the trigger voltage will be reached. When that voltage is reached, the ESD structure (transistors T1, T2 in FIG. 2) will become active and current begins to flow. The voltage at the Hi terminal immediately drops to a "snap back" voltage and then holds. The current continues to increase during the transient event. The key parameters for ESD performance are a low "trigger" voltage so that the ESD protection starts before a destructive voltage is reached, and a sufficient holding voltage Vh. The current the ESD structure can support during the transient is also a performance characteristic. The embodiments provide an adjustable trigger voltage and good performance for the ESD structures when compared to prior approaches, and, the embodiments are also fully compatible with LDMOS processes, unlike the prior approaches.

Use of the embodiments has been shown to provide ESD protection structures with improved results. In devices formed implementing the embodiments, a human body model (HBM) test using a transmission line pulse (TLP) as the ESD strike was performed. In one example, the test TLP was 100 nanoseconds in duration.

FIG. 11 compares the I-V curve for the TLP obtained for three devices. A prior approach or "regular" NMOS device, without the ESD implants, such as in FIG. 1, was measured. A "triggered" NMOS formed without the use of the embodiments was measured. A triggered NMOS device using the embodiments, such as shown in FIG. 2, was measured. As shown in FIG. 11, the trigger voltage for the "regular NMOS" is quite high, about 8.9 volts, while the trigger voltage for the triggered examples are about the same, about 5.5 Volts. The circuits all exhibit the "snap back" phenomenon after triggering, with the hold voltage less than about 4 Volts for the "triggered' NMOS, the "regular" NMOS hold voltage is much higher, about 4.6 Volts.

FIG. 12 depicts measurements for the experimental devices in a table view. The devices were fabricated in an advanced semiconductor process and with NMOS transistors of sizes of 360 microns in width, and 0.4 microns in length. The devices also included resist protect oxide (RPO) of two thicknesses, 1.95 micron, and 1 micron. The "regular" NMOS devices without a trigger implant (such as shown in FIG. 1) had a trigger voltage during a TLP event of 8.69 Volts, for example, and a holding voltage of 4.42 Volts, while the current sustained during the event, labeled It2, was 2.31 Amperes. The performance of the triggered NMOS devices using the ESD implant of the embodiments, such as in FIG. 2, is shown at the bottom two rows of the table. The trigger voltage was lowered to 5.49 Volts or 5.51 Volts, depending on the RPO thickness, and the holding voltages were lowered to 3.88-3.84 Volts. The current sustained during the TLP increased to 3.89 Amperes, for the thicker RPO, and 3.22 amperes for the transistors with the thinner RPO. The use of the embodiment diodes in the inserted active area thus improves performance by both lowering the trigger voltage and by increasing the current that can be sustained during an event.

A variety of modifications apparent to one skilled in the art can be made to the example embodiments described above and these apparent modifications create additional alternative embodiments which are also contemplated herein and which fall within the scope of the appended claims. For example, an N-type substrate may be used with a plurality of P-wells and the conductivity types of the N+ and P+ diffusions may be reversed to form additional structures, as is known in the art. Electrical connections may be modified as described above to form additional embodiments, and the embodiments may be combined with deep N or P wells to form still more embodiments within the scope of this disclosure.

In an embodiment, a semiconductor device includes a semiconductor substrate of a first conductivity type; a first active area containing an ESD cell coupled to a first terminal and disposed in a well of the first conductivity type; a second active area in the semiconductor substrate, separated from the first active area by an isolation region, the second active area comprising a first diffusion of the first conductivity type for making a bulk contact to the well and coupled to a second terminal; and a third active area in the semiconductor substrate, separated from the first and second active areas by another isolation region, the third active area comprising a first diffusion of a second conductivity type opposite to the first conductivity type, and a portion of the third active area comprising an implant diffusion of the first conductivity type within the first diffusion of the second conductivity type and adjacent a boundary with the well of the first conductivity type; wherein the third active area comprises a diode coupled to the terminal and reverse biased with respect to the well of the first conductivity type.

In another embodiment, in the above semiconductor device, the first terminal is a terminal for receiving a high voltage supply, and the second terminal is a ground terminal. In a further embodiment, the ESD cell in the semiconductor device further includes a drain diffusion region of the second conductivity type, coupled to the first terminal; a source diffusion region of the second conductivity type, spaced from the drain diffusion region by a channel region, and coupled to the second terminal; and a gate formed over the channel region and over a surface of the semiconductor substrate; wherein the drain diffusion region, the well, and the source diffusion region form a lateral bipolar transistor with a base portion being formed by the well.

In yet another embodiment, in the semiconductor device, the ESD cell further includes an NMOS device. In an alternative embodiment, the ESD cell further includes a FOX device. In still another embodiment, in the semiconductor device above, the second active area surrounds the first active area and the third active area surrounds the second active area. In yet another embodiment, in the semiconductor device above, the third active area surrounds the first active area and the second active area surrounds the third active area. In another embodiment, in the semiconductor device the first conductivity type is a P conductivity type. In another embodiment, in the semiconductor device, the second conductivity type is an N conductivity type. In still another embodiment, in the above semiconductor device the implant diffusion in the third active area is segmented. In a further embodiment, in the above semiconductor device, the implant diffusion in the third active area partially overlies the diffusion of the second conductivity type in the third active area.

In yet another embodiment, an integrated circuit includes logic circuitry coupled between a high voltage supply terminal and a ground terminal on a semiconductor substrate; at least one ESD structure coupled between the high voltage supply terminal and the ground terminal, and further including an ESD cell formed in a first active area within a p-type well region disposed in the semiconductor substrate, and coupled between the high voltage supply terminal and the ground terminal; a bulk contact formed as a p-type diffusion in a second active area surrounding and electrically isolated from the first active area; a third active area electrically isolated from the first and second active area comprising a diode formed from an n-type diffusion with a p-type implant formed adjacent a boundary between the n-type diffusion and the p-type well region, the n-type diffusion coupled to the high voltage terminal.

In further embodiments, in the above integrated circuit, the diode is reverse biased with respect to the high voltage supply. In still another embodiment, in the above integrated circuit, the third active area is disposed around the first active area and the second active area is disposed around the third active area. In yet another embodiment, in the above integrated circuit, the second active area is disposed around the first active area, and the third active area is disposed around the second active area. In still another embodiment, in the above integrated circuit, the ESD cell includes at least one NMOS transistor. In yet another embodiment, the ESD cell includes one selected from a group consisting essentially of an NMOS ESD structure, a FOX ESD structure, and an SCR ESD structure.

In another embodiment, a method includes forming an ESD cell coupled to a high voltage supply terminal in a first active area in well of a first conductivity type disposed in a semiconductor substrate; forming a second active area surrounding and electrically isolated from the first active area, the second active area comprising a diffusion of the first conductivity type forming a bulk contact to the well coupled to a ground terminal; and forming a third active area proximate to and surrounding the first active area and electrically isolated from the first and second active areas, the third active area comprising a diffusion region of a second conductivity type coupled to the high voltage supply terminal and an implant region of the first conductivity type formed adjacent a boundary of the diffusion region of the second conductivity type and the well; wherein the diffusion region and the implant region in the third active are comprises a reverse biased diode with respect to the high voltage supply terminal.

In yet another embodiment, in the above method, the third active area is formed surrounding the first active area, and the second active area is formed surrounding the first active area. In a further alternative embodiment, in the above method, the second active area is formed surrounding the first active area, and the third active area is formed surrounding the first active area.

Although the illustrative embodiment and its advantages have been described in detail, it should be understood that various changes, substitutions, and alterations can be made herein without departing from the spirit and scope of the invention as defined by the appended claims. For example, alternate materials, implant doses and temperatures may be implemented.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a substrate of a first conductivity type;
   a first active area in the substrate containing an electrostatic discharge cell coupled to a first terminal and disposed in a well of the first conductivity type;
   a second active area in the substrate, the second active area separated from the first active area by an one or more isolation regions, the second active area comprising a first highly-doped region of the first conductivity type; and
   a third active area in the substrate, the third active area separated from the first and second active areas by one or more isolation regions, the third active area comprising a reverse-biased diode, the reverse-biased diode comprising a first lightly-doped region of the first conductivity type abutting a second highly-doped region of a second conductivity type, the first lightly-doped region having a higher dopant concentration than the well.

2. The semiconductor device of claim 1, wherein the second active area is interposed between the third active area and the first active area.

3. The semiconductor device of claim 1, wherein the third active area is interposed between the second active area and the first active area.

4. The semiconductor device of claim 1, wherein a width of the first lightly-doped region is less than a width of the second highly-doped region.

5. The semiconductor device of claim 1, wherein a width of the first lightly-doped region is greater than a width of the second highly-doped region.

6. The semiconductor device of claim 1, wherein the first lightly-doped region and the second highly-doped region have a same width.

7. The semiconductor device of claim 1, wherein the first lightly-doped region overlaps the second highly-doped region.

8. A method comprising:
   forming an electrostatic discharge (ESD) cell in a first active area, the first active area being in a well of a first conductivity type disposed in a semiconductor substrate;
   forming a first isolation ring around the first active area;
   forming a second isolation ring around the first active area;
   forming a second active area surrounding the first isolation ring, the second active area comprising a first highly-doped region of the first conductivity type; and
   forming a reverse biased diode in a third active area, the third active area surrounding the first active area and separated from the second active area by the second isolation ring, the reverse biased diode comprising a first lightly-doped region of the first conductivity type and a second highly-doped region of a second conductivity type, the first lightly-doped region having a higher dopant concentration than the well.

9. The method of claim 8, wherein the second active area is interposed between the third active area and the first active area.

10. The method of claim 8, wherein the third active area is interposed between the second active area and the first active area.

11. The method of claim 8, wherein the ESD cell and the first highly-doped region are electrically coupled to a first terminal, and wherein the ESD cell and the second highly-doped region are electrically coupled to a second terminal.

12. The method of claim 11, wherein the ESD cell comprises:
   a drain region coupled to the first terminal, the drain region being of the second conductivity type;
   a source region coupled to the second terminal, the source region being of the second conductivity type; and
   a channel region interposed between the drain region and the source region; and
   a gate formed over the channel region;
   wherein the drain region, the well, and the source region form a lateral bipolar transistor with a base portion being formed by the well.

13. A method comprising:
   forming a first isolation ring surrounding a first active area;
   forming a second isolation ring surrounding the first isolation ring, the second isolation ring separating a second active area and a third active area;
   forming an electrostatic discharge (ESD) cell in the first active area, the ESD cell being coupled to a first terminal and a second terminal, the first terminal being a voltage supply terminal; forming a reverse-biased diode in the second active area with respect to the first terminal, wherein forming the reverse-biased diode comprises forming a lightly-doped region of a second conductivity type, the lightly-doped region having a higher dopant concentration than an adjacent substrate well and forming a first highly-doped region of a first conductivity type, the lightly-doped region abutting the first highly-doped region; and
   forming a body contact in the third active area.

14. The method of claim 13, wherein the forming the ESD cell comprises:
- forming a second highly-doped region of a first conductivity type;
- forming a third highly-doped region of the first conductivity type;
- forming a fourth highly-doped region of the first conductivity type, the third highly-doped region being interposed between the second highly-doped region and the third highly-doped region;
- forming a first gate over an area between the second highly-doped region and the fourth highly-doped region;
- forming a second gate over an area between the third highly-doped region and the fourth highly-doped region;
- electrically coupling the second highly-doped region, the third highly-doped region, the first gate and the second gate to the second terminal; and
- electrically coupling the fourth highly-doped region to the first terminal.

15. The method of claim 14, further comprising electrically coupling the first highly-doped region to the first terminal.

16. The method of claim 14, further comprising:
- forming a first plurality of contacts to the second highly-doped region;
- forming a second plurality of contacts to the third highly-doped region; and
- forming a third plurality of contacts to the fourth highly-doped region.

17. The method of claim 13, wherein the first isolation ring and the second isolation ring extends lower than the reverse-biased diode.

18. The method of claim 13, wherein the second active area is interposed between the third active area and the first active area.

19. The method of claim 13, wherein the third active area is interposed between the second active area and the first active area.

20. The method of claim 13, wherein the lightly-doped region is one of a plurality of lightly-doped regions underlying the first highly-doped region.

* * * * *